United States Patent
Ross et al.

[11] Patent Number: 6,128,765
[45] Date of Patent: Oct. 3, 2000

[54] MAXIMUM A POSTERIOR ESTIMATOR WITH FAST SIGMA CALCULATOR

[75] Inventors: John Anderson Fergus Ross, Schenectady; Abdallah Mahmoud Itani, Ballston Spa; Nick Andrew Van Stralen, Schenectady; Stephen Michael Hladik, Albany, all of N.Y.

[73] Assignee: General Electric Company, Schenectady, N.Y.

[21] Appl. No.: 09/137,260

[22] Filed: Aug. 20, 1998

[51] Int. Cl.$^7$ .................................. H03M 13/03
[52] U.S. Cl. .................... 714/786; 714/791; 714/792; 375/265
[58] Field of Search ................... 714/755, 757, 714/791, 792, 786–788, 794–796; 375/262–265, 341

[56] References Cited

U.S. PATENT DOCUMENTS

| | | | |
|---|---|---|---|
| 5,406,570 | 4/1995 | Berrou et al. | 714/792 |
| 5,446,747 | 8/1995 | Berrou | 714/788 |
| 5,721,745 | 2/1998 | Hladik et al. | 714/755 |
| 5,721,746 | 2/1998 | Hladik et al. | 714/792 |
| 5,734,962 | 3/1998 | Hladik et al. | 455/12.1 |
| 6,002,716 | 12/1999 | Meyer et al. | 375/231 |
| 6,023,783 | 2/2000 | Divsalar et al. | 714/792 |
| 6,028,799 | 2/2000 | Petersen | 375/341 |
| 6,044,111 | 3/2000 | Meyer et al. | 375/231 |

OTHER PUBLICATIONS

"Illuminating the Structure of Code and Decoder of Parallel Concatenated Recursive Systematic (Turbo) Codes," Patrick Robertson, IEEE, 1994, pp. 1298–1303.

"Optimal Decoding of Linear Codes for Minimizing Symbol Error Rate," LR Bahl, J Cocke, F. Jelinek; J. Raviv, IEEE Transactions on Information Theory, Mar. 1974, pp. 284–287.

"Near Shannon Limit Error–Correcting Coding and Decoding: Turbo–Codes (1)," Claude Berrou, Alain Glavieux; Punya Thitimajshima, IEEE, 1993, pp. 1064–1070.

*Primary Examiner*—Emmanuel L. Moise
*Attorney, Agent, or Firm*—Jill M. Breedlove; Douglas E. Stoner

[57] ABSTRACT

Forward and backward recursive calculations in a maximum a posteriori decoding process are performed in parallel processes, rather than sequentially, allowing the a posteriori transition probabilities to be calculated in the same time interval as the recursions, thereby reducing decoding latency and required memory.

10 Claims, 5 Drawing Sheets fig. 1 fig. 3 fig. 4 fig. 5

MAXIMUM A POSTERIOR ESTIMATOR WITH FAST SIGMA CALCULATOR

BACKGROUND OF THE INVENTION

The present invention relates generally to error-correction coding and, more particularly, to trellis codes and to parallel concatenated convolutional coding, i.e., turbo coding.

A new class of forward error control codes, referred to as turbo codes, offers significant coding gain for power limited communication channels. Turbo codes are generated by using two or more recursive systematic encoders operating on different orderings of the same information bits. A subset of the code bits generated by each encoder is transmitted to maintain bandwidth efficiency. Turbo decoding involves an iterative algorithm in which probability estimates of the information bits that are derived for one of the code words are fed back to a probability estimator for the other code word. Each iteration of processing generally increases the reliability of the probability estimates. This process continues, alternately decoding the two code words until the probability estimates can be used to make reliable decisions.

The maximum a posteriori (MAP) algorithm introduced by Bahl, Cocke, Jelinek, and Raviv in "Optimal Decoding of Linear Codes for Minimizing Symbol Error Rate", IEEE Transactions on Information Theory, March 1974, pp. 284–287, is particularly useful as a component decoder in decoding parallel concatenated convolutional codes, i.e., turbo codes. The MAP algorithm is used in the turbo decoder to generate a posteriori probability estimates of the systematic bits (i.e., information bits) in the code word. These probability estimates are used as a priori symbol probabilities for the second MAP decoder. Three fundamental terms in the MAP algorithm are: forward and backward state probability functions (the alpha and beta functions, respectively) and the a posteriori transition probabilities (the sigma function).

It is desirable to reduce the time for computation and memory required in turbo decoding, such as by providing a method for performing forward and reverse recursions simultaneously, thereby improving decoder performance even further.

SUMMARY OF THE INVENTION

Forward and backward recursive calculations in a maximum a posteriori decoding process are performed in parallel processes. Such parallel computations allow for calculation of the a posteriori transition probabilities in the same time interval as that for the forward and backward recursions, thereby reducing decoding latency and required memory.

DETAILED DESCRIPTION OF THE INVENTION

Summary of the MAP Decoding Algorithm

The maximum a posteriori (MAP) algorithm for decoding linear codes was published by Bahl, Cocke, Jelinek, and Raviv, as cited hereinabove. Basically, this algorithm calculates the a posteriori probability of each state in a trellis corresponding to a received code word conditioned on the entire received code word. A variation of this algorithm calculates the a posteriori probability of each state transition in a trellis corresponding to a received code word conditioned on the received code word. Since this variation is of particular interest when decoding recursive systematic convolutional codes, which are typically utilized in turbo coding, the description of the invention will be built around this form of the algorithm. However, the invention also applies to the version of the MAP algorithm that calculates a posteriori state probabilities in a straightforward manner.

Figure 1:
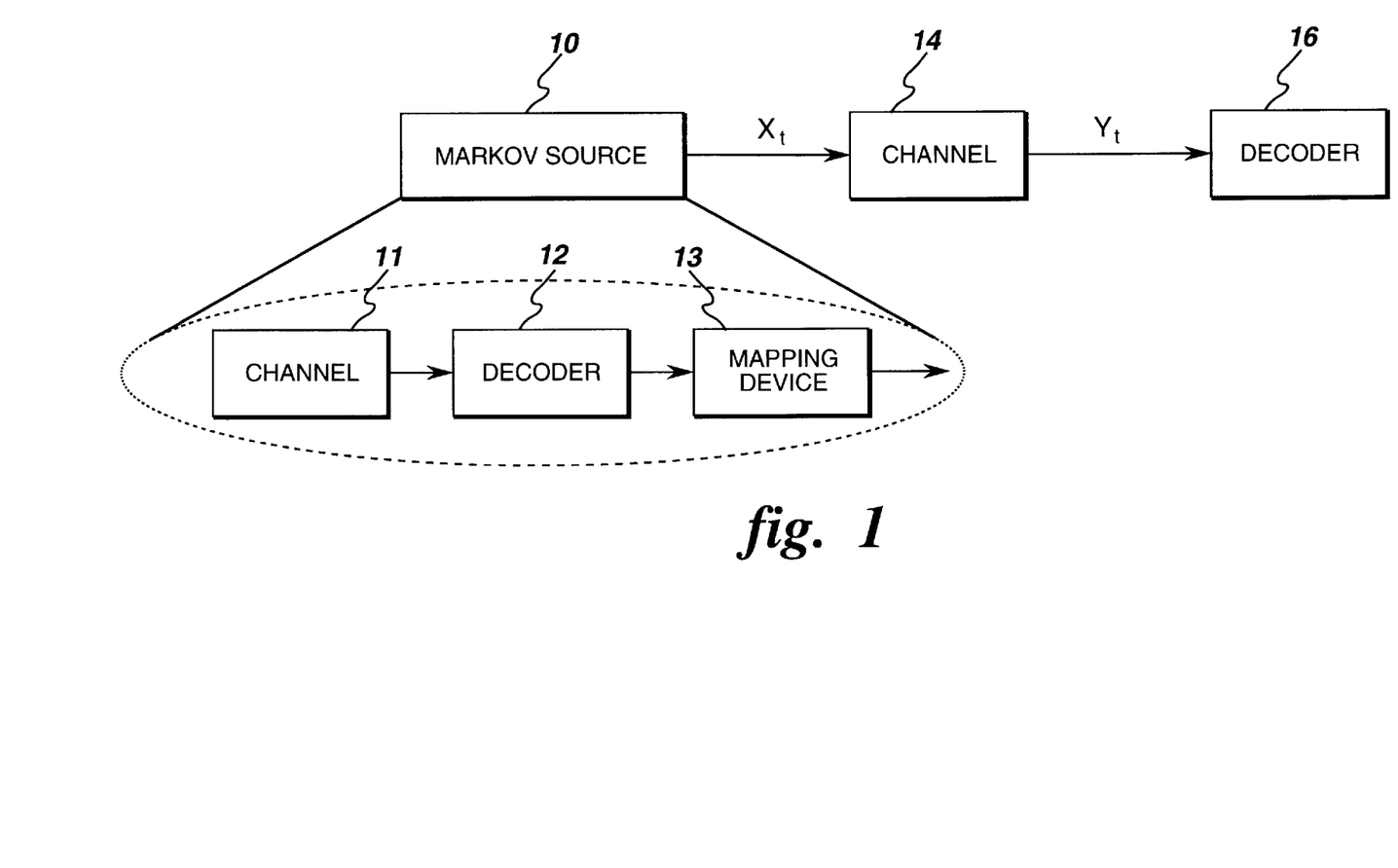
FIG. 1 is a block diagram of a simple communications system comprising a Markov source, a memoryless channel and decoder.

Consider the simple communication system block diagram of FIG. 1 for the purpose of describing the MAP algorithm. The source 10 is a discrete-time, finite-state Markov process, shown as comprising a source 11, an encoder 12, and a mapping device 13. As shown, the Markov source's output at time t is $X_t$ and the corresponding channel 14 output is $Y_t$, which is provided as the input to a decoder 16. The following definitions are also needed to describe the MAP algorithm. Let M=the number of distinct states of the Markov source;

m=the index of the Markov source's states $\{0,1, \ldots, M-1\}$;

$S_t$=state of the Markov source at time t;

$S_t^u = S_t, S_{t+1}, \ldots S_u$, the state sequence of the Markov source from time t to time u;

$X_t^u = X_t, X_{t+1}, \ldots X_u$, the output sequence of the Markov source from time t to time u;

$Y_t^u = Y_t, Y_{t+1}, \ldots Y_u$, the output sequence of the channel from time t to time u, and L=the length of the Markov source's output sequence. Furthermore, it is assumed that the source's initial state $S_0=0$ and its final state $S_L=0$.

The channel is noisy and memoryless so that a sequence of the source's output symbols $X_t^u$ is transformed into a sequence of channel outputs $Y_t^u$ according to the following channel transition probabilities.

$$\Pr\{Y_t^u | X_t^u\} = \Pr\{Y_t | X_t\} \Pr\{Y_{t+1} | X_{t+1}\} \ldots \Pr\{Y_u | X_u\} \quad (1)$$

The decoder examines the received channel output sequence and estimates the a posteriori probabilities of the Markov source's states or state transitions. The state a posteriori probabilities $\Pr\{S_t = m | Y_1^L\}$ can be written as $$\Pr\{S_t = m | Y_1^L\} = \Pr\{S_t = m; Y_1^L\} / \Pr\{Y_1^L\} \quad (2)$$

using the definition of conditional probability. Our notation is as follows: $\Pr\{A|B\}$ means the conditional probability of event A given event B, and $\Pr\{A;B\}$ means the joint probability of events A and B. Similarly, the source's state transition a posteriori probabilities can be written as $$\Pr\{S_{t-1} = m'; S_t = m | Y_1^L\} = \Pr\{S_{t-1} = m'; S_t = m; Y_1^L\} / \Pr\{Y_1^L\}. \quad (3)$$

It turns out that it is easier to derive an algorithm to calculate the joint probabilities on the right-hand sides of equations (2) and (3). The desired conditional probabilities can then be obtained by simply dividing these joint probabilities by the constant $\Pr\{Y_1^L\}$. To clarify the derivation, Bahl et al. defined the following probability functions.

$$\alpha_t(m) = \Pr\{S_t = m; Y_1^t\} \quad (4)$$

$$\beta_t(m) = \Pr\{Y_{t+1}^L | S_t = m\} \quad (5)$$

$$\gamma_t(m',m) = \Pr\{S_t = m; Y_t | S_{t-1} = m'\} \quad (6)$$

It can be shown that $$\Pr\{S_t=m; Y_1^L\}=\alpha_t(m)\beta_t(m) \quad (7)$$

and $$\Pr\{S_{t-1}=m'; S_t=m; Y_1^L\}=\alpha_{t-1}(m')\gamma_t(m',m)\beta_t(m) \quad (8)$$

so all that remains is to calculate the values of $\alpha_t(m)$ $\gamma_t(m',m)$ and $\beta_t(m)$ for all values of m and t. It can be shown that for t=1,2, ..., L, $\alpha_t(m)$ can be calculated recursively as follows.

$$\alpha_t(m) = \sum_{m'=0}^{M-1} \alpha_{t-1}(m')\gamma_t(m', m) \quad (9)$$

For t=0, the boundary conditions are $\alpha_0(0)=1$ and $\alpha_0(m)=0$ for all m≠0. Similarly, $\beta_t(m)$ can be calculated recursively for t=1,2, ..., L−1.

$$\beta_t(m) = \sum_{m'=0}^{M-1} \beta_{t+1}(m')\gamma_{t+1}(m, m') \quad (10)$$

For t=L, the boundary conditions are $\beta_L(0)=1$ and $\beta_L(m)=0$ for all m≠0.

$$\gamma_t(m', m) = \sum_X \Pr\{S_t = m \mid S_{t-1} = m'\} \quad (11)$$
$$\Pr\{X_t = X \mid S_t = m; S_{t-1} = m'\}\Pr\{Y_t \mid X\}$$

For the cases of interest to us, the source's mapping of state transitions to output symbols is deterministic; i.e. there is only one possible output symbol X for each state transition, so that $\Pr\{X_t|S_t=m; S_{t-1}=m'\}=1$ and $\gamma_t(m',m)$ can be written as $$\gamma_t(m',m)=\Pr\{S_t=m|S_{t-1}=m'\}\Pr\{Y_t|X_t\}. \quad (12)$$

The calculation of $\Pr\{S_{t-1}=m'; S_t=m; Y_1^L\}$ using the algorithm of Bahl et al. can be summarized as follows.
1. $\alpha_0(0)=1$ and $\alpha_0(m)=0$ for all m≠0.
   $\beta_L(0)=1$ and $\beta_L(m)=0$ for all m≠0.
2. As soon as $Y_t$ is received, the decoder computes $\gamma_t(m',m)$ using equation (11) and $\alpha_t(m)$ using equation (9). The calculated values of $\alpha_t(m)$ are stored for all t and m. The calculated values of $\gamma_t(m',m)$ are stored for all t and all transitions (m',m).
3. After the complete sequence of channel outputs $\gamma_1^L$ is received, the decoder recursively computes $\beta_t(m)$ using equation (10). When all of the $\beta_t(m)$ have been computed, they can be multiplied by the appropriate $\alpha_{t-1}(m')$ and $\gamma_t(m',m)$ to obtain $\Pr\{S_{t-1}=m';S_t=m; Y_1^L\}$ as in equation (8). When decoding trellis codes, the Markov source of FIG. 1 can be modeled as comprising a source of information bits, an encoder for the error correcting trellis code, and a mapping device that converts the encoder's output into symbols $X_t$, which are transmitted over the channel.

The term $\Pr\{S_t=m|S_{t-1}=m'\}$, the encoder's conditional state probability, in equation (12) is calculated as $$\Pr\{S_t = m \mid S_{t-1} = m'\} = \prod_{i=(t-1)k+1}^{tk} \Pr\{d_i = a_i(m', m)\} \quad (13)$$

for an (n,k,v) code where $\Pr\{d_i=a_i(m',m)\}$ is the a priori probability that $d_i=a_i(m',m)$ and $a_i(m',m)$ is the $i^{th}$ bit of the sequence a(m',m) of k bits that drives the encoder from state m' to state m. This equation holds when the code's trellis does not have parallel branches. (If the code's trellis does have parallel branches, then $\Pr\{S_t=m|S_{t-1}=m'\}$ is calculated as the sum of products of bit a priori probabilities in which the sum is over the all of the sequences of source bits a(m',m) that drive the encoder from state m' to state m.) In the decoder, we are interested in event likelihood ratios; specifically, we are interested in $\Pr\{d_\tau=1|Y_1^L\}/\Pr\{d_\tau=0|Y_1^L\}$, where $\Pr\{d_\tau=i|Y_1^L\}$ represents the a posteriori probability that data bit $d_\tau$ from the source is equal to i∈{0,1}.

$$\Pr\{d_\tau = 0 \mid Y_1^L\} = \sum_{(m',m)\in A_t(\tau)} \Pr\{S_{t-1} = m'; S_t = m \mid Y_1^L\} = \quad (14)$$

$$\frac{\displaystyle\sum_{(m',m)\in A_t(\tau)} \Pr\{S_{t-1} = m'; S_t = m; Y_1^L\}}{\Pr\{Y_1^L\}}$$

In the equation above $A_t(\tau)$ is the set of all state transitions (m',m) in the encoder which terminate at time t due to an information bit $d_\tau=0$. Recall that in general there are k source bits encoded into each n-bit encoder output symbol so that $d_\tau$ for indices $\tau=(t-1)k+1, (t-1)k+2, \ldots$, tk are associated with the state transition $S_{t-1}$ to $S_t$.

$$\Pr\{d_\tau = 1 \mid Y_1^L\} = \sum_{(m',m)\in B_t(\tau)} \Pr\{S_{t-1} = m'; S_t = m \mid Y_1^L\} = \quad (15)$$

$$\frac{\displaystyle\sum_{(m',m)\in B_t(\tau)} \Pr\{S_{t-1} = m'; S_t = m; Y_1^L\}}{\Pr\{Y_1^L\}}$$

In the equation above $B_t(\tau)$ is the set of all state transitions (m',m) in the encoder which terminate at trellis level t due to an information bit $d_\tau=1$. Since we are working with the likelihood ratio $\Pr\{d_\tau=1|Y_1^L\}/\Pr\{d_\tau=0|Y_1^L\}$, it is not necessary to calculate $\Pr\{S_{t-1}=m'; S_t=m|Y_1^L\}$; we may use $\Pr\{S_{t-1}=m';S_t=m; Y_1^L\}$ directly since $\Pr\{Y_1^L\}$ is common to the numerator and denominator. Therefore, the desired likelihood ratio from the decoder is $$\lambda(d_\tau) = \frac{\Pr\{d_\tau = 1 \mid Y_1^L\}}{\Pr\{d_\tau = 0 \mid Y_1^L\}} \quad (16)$$

$$= \frac{\displaystyle\sum_{(m',m)\in B_t(\tau)} \Pr\{S_{t-1} = m'; S_t = m; Y_1^L\}}{\displaystyle\sum_{(m',m)\in A_t(\tau)} \Pr\{S_{t-1} = m'; S_t = m; Y_1^L\}}.$$

Since the joint probability $\Pr\{S_{t-1}=m'; S_t=m; Y_1^L\}$ is used often herein, the following notation from Bahl et aL is introduced for brevity.

$$\sigma_t(m',m)=\Pr\{S_{t-1}=m'; S_t=m; Y_1^L\}=\alpha_{t-1}(m')\gamma_t(m',m)\beta_t(m) \quad (17)$$

When the encoder's input symbols are binary, i.e. k=1, equations (13) through (16) can be simplified since τ=t in this case. The simplified equations are presented below.

$$\Pr\{S_t=m|S_{t-1}=m'\}=P\{d_t=a(m',m)\} \quad (18)$$

where a(m',m)=the bit value that drives the encoder from state m' to state m.

$$Pr\{d_t = 0 | Y_1^L\} = \sum_{(m',m) \in A_t} Pr\{S_{t-1} = m'; S_t = m | Y_1^L\} = \quad (19)$$

$$\frac{\sum_{(m',m) \in A_t} Pr\{S_{t-1} = m'; S_t = m; Y_1^L\}}{Pr\{Y_1^L\}} = \frac{\sum_{(m',m) \in A_t} \sigma_t(m', m)}{Pr\{Y_1^L\}},$$

where $A_t$=the set of all state transitions (m',m) which terminate at level t in the encoder due to an information bit $d_t$=0.

$$Pr\{d_t = 1 | Y_1^L\} = \sum_{(m',m) \in B_t} Pr\{S_{t-1} = m'; S_t = m | Y_1^L\} = \quad (20)$$

$$\frac{\sum_{(m',m) \in B_t} Pr\{S_{t-1} = m'; S_t = m; Y_1^L\}}{Pr\{Y_1^L\}} = \frac{\sum_{(m',m) \in B_t} \sigma_t(m', m)}{Pr\{Y_1^L\}}, \text{ where}$$

$B_t$=the set of all state transitions (m',m) which terminate at trellis level t in the encoder due to an information bit $d_t$=1.

$$\lambda(d_t) = \frac{Pr\{d_t = 1 | Y_1^L\}}{Pr\{d_t = 0 | Y_1^L\}} = \quad (21)$$

$$\frac{\sum_{(m',m) \in B_t} Pr\{S_{t-1} = m'; S_t = m; Y_1^L\}}{\sum_{(m',m) \in A_t} Pr\{S_{t-1} = m'; S_t = m; Y_1^L\}} = \frac{\sum_{(m',m) \in B_t} \sigma_t(m', m)}{\sum_{(m',m) \in A_t} \sigma_t(m', m)}.$$

Description of the Log-MAP Decoder

The MAP decoder algorithm presented earlier requires a large number of multiplications. For some implementations wherein a large number of multiplications may be impractical, e.g., integrated circuit implementations, a logarithmic version of the MAP algorithm has been derived that eliminates all multiplication operations. The log-MAP algorithm primarily uses additions, table look-ups, and some simple logic functions. In an integrated circuit implementation of a decoder for trellis codes, the replacement of multiplications with additions enables large savings in gate count (die area) and significant increases in decoding speed. The following is a summary of the basic log-MAP algorithm.

Equations (7) through (10) become $$\ln Pr\{S_t = m; Y_1^L\} = \ln \alpha_t(m) + \ln \beta_t(m), \quad (22)$$

$$\ln Pr\{S_{t-1} = m'; S_t = m; Y_1^L\} = \ln \sigma_t(m',m) = \ln \alpha_{t-1}(m') + \ln \gamma_t(m',m) + \ln \beta_t(m), \quad (23)$$

$$\ln \alpha_t(m) = \ln \sum_{m'=0}^{M-1} \exp(\ln \alpha_{t-1}(m') + \ln \gamma_t(m', m)), \text{ and} \quad (24)$$

$$\ln \beta_t(m) = \ln \sum_{m'=0}^{M-1} \exp(\ln \beta_{t+1}(m') + \ln \gamma_{t+1}(m, m')). \quad (25)$$

Equations (24) and (25) are derived from equations (9) and (10), respectively, by applying the identity $$a \cdot b = \exp(\ln [a \cdot b]) = \exp(\ln a + \ln b)$$

to the product terms. For example, equation (24) is derived as follows:

$$\ln \alpha_t(m) = \ln \sum_{m'=0}^{M-1} \alpha_{t-1}(m') \gamma_t(m', m)$$

$$= \ln \sum_{m'=0}^{M-1} \exp(\ln [\alpha_{t-1}(m') \gamma_t(m', m)])$$

$$= \ln \sum_{m'=0}^{M-1} \exp(\ln \alpha_{t-1}(m') + \ln \gamma_t(m', m)).$$

The boundary conditions are now $\ln \alpha_0(0) = 0$ and $\ln \alpha_0(m) = -\infty$ for all $m \neq 0$. Similarly, $\ln \beta_L(0) = 0$ and $\ln \beta_L(m) = -\infty$ for all $m \neq 0$. In a practical implementation, a large negative number is substituted for $-\infty$.

The sum of exponential terms can be computed by applying the following identity.

$$\ln [\exp(a) + \exp(b)] = \max(a,b) + \ln [1 + \exp(-|a-b|)] \quad (26)$$

Computational complexity can be significantly reduced by storing a table of values for the function $\ln [1+\exp(-|a-b|)]$ and applying equation (33). Experimentation has shown that 8 or 16 values of this function provide sufficient resolution to prevent performance degradation.

Equation (12) becomes $$\ln \gamma_t(m',m) = \ln Pr\{S_t = m | S_{t-1} = m'\} + \ln Pr\{Y_t | X\}. \quad (27)$$

The log-likelihood ratio is calculated using the identity of equation (26) as follows:

$$\Lambda^e(d_t) = \ln \lambda^e(d_t) = \ln \sum_{(m',m) \in B_t} \sigma_t^e(m', m) - \ln \sum_{(m',m) \in A_t} \sigma_t^e(m', m) \quad (27a)$$

Preferred Embodiments of the Invention

Turbo codes involve a parallel concatenation of two or more systematic codes. Decoding turbo codes is an iterative operation such that the work in decoding one component code is used as a priori information for decoding another component code. Iterations proceed a finite number of times with the passing of information between decoders comprising feedback in the decoding process.

As set forth in the Summary of the MAP Decoding Algorithm set forth hereinabove, some of the fundamental terms in a MAP decoding algorithm are forward and backward state probabilities, commonly known as the alpha and beta functions, and a posteriori state transition probabilities, commonly known as the sigma functions. Calculations of these probabilities (i.e., the alpha, beta and sigma functions) require symbol transition probabilities, i.e., the gamma functions. From Bahl, Cocke, Jelinek, and Raviv in "Optimal Decoding of Linear Codes for Minimizing Symbol Error Rate", cited hereinabove, $$\gamma_t(m', m) = \sum_{X_t} P_t(m | m') q_t(X | m', m) R(Y_t | X_t) \quad (22)$$

where t is the symbol index and $$R(Y_t \mid X_t) = \prod_{j=1}^{J} R(Y_{tj} \mid X_{tj}) \qquad (23)$$

where J is the number of bits comprising an encoder output symbol, assuming binary signaling.

In a recursive systematic code, a single transition (m', m) determines a specific channel symbol Xd& so that the summation in equation 22 is eliminated and the function $q_t(X_t|m',m)$ is identically equal to one. Also, for a (2, 1) code, the channel transition probabilities are computed as the product of two one-dimensional transition probabilities for the information and parity bits; that is, $$R(X_t|Y_t) = R(Y_{ti}|X_{ti})R(Y_{tp}|X_{tp}). \qquad (24)$$

Furthermore, in the turbo decoding procedure, the conditional state probabilities are determined by the a priori bit probabilities as follows:

$$P_t(m|m') = AP_t(0) \text{ if } X_{ti}|m,m'=0 \qquad (25)$$

$$P_t(m|m') = AP_t(1) \text{ if } X_{ti}|m,m'=1 \qquad (26)$$

so that $$\gamma_t(m',m) = AP(0)R(Y_i|0)R(Y_p|X_p) \text{ if } X_{ti}|m,m'=0 \qquad (27)$$

$$\gamma_t(m',m) = AP(1)R(Y_i|1)R(Y_p|X_p) \text{ if } X_{ti}|m,m'=1 \qquad (28).$$

The time index has been omitted in equations (27) and (28) for brevity.

The output of a MAP component decoder is an a posteriori probability estimate of the systematic symbols. These a posteriori estimates are used as the a priori probabilities $AP_t(0)$ and $AP_t(1)$ for decoding another component code. The a posteriori probability of bit t being equal to 1(0) is found by summing all $\sigma_t(m',m)$ over the state transition pairs (m',m) which correspond to a 1(0) being transmitted where $$\sigma_t(m',m) = \alpha_{t-1}(m')\beta_t(m)\gamma_t(m',m). \qquad (29)$$

Thus, for each time interval a vector $\sigma_t = \{\sigma_t(m',m); \text{ all } (m',m)\}$ is computed.

The calculation of the $\alpha$ values requires a forward recursion while the calculation of the $\beta$ values requires a backward recursion. According to preferred embodiments of the present invention, both forward and backward recursions are performed simultaneously, i.e., in parallel. Moreover, only the first half of the calculated $\alpha$ and $\beta$ values need to be stored in memory. Two $\sigma$ vectors per recursion step may be computed once half the $\alpha$ and $\beta$ values have been computed. See FIG. 2 for a time-line representation of the parallel calculation of the $\alpha$ and $\beta$ values, illustrating how the $\sigma$ values are computed when the $\alpha$ and $\beta$ values "meet".

Figure 2:
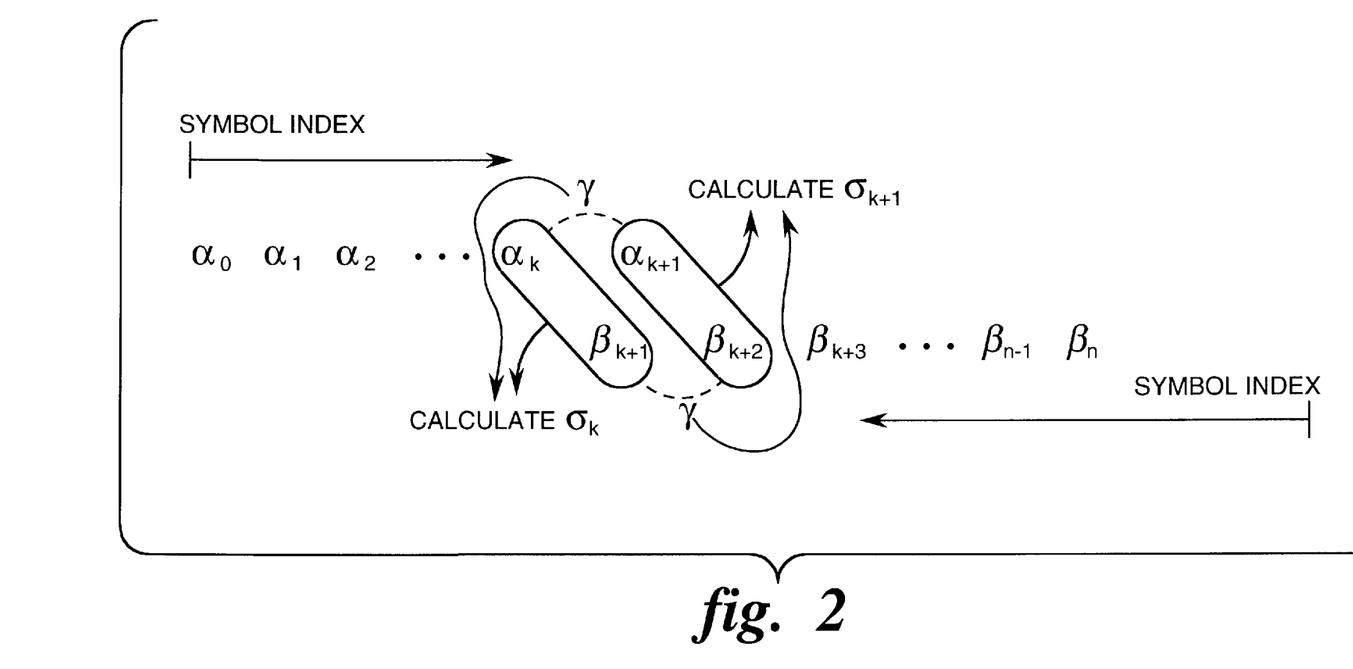
FIG. 2 is a time-line representation of the parallel calculation of the $\alpha$ and $\beta$ values, illustrating how the $\sigma$ values are computed when the $\alpha$ and $\beta$ values "meet"
Figure 3:
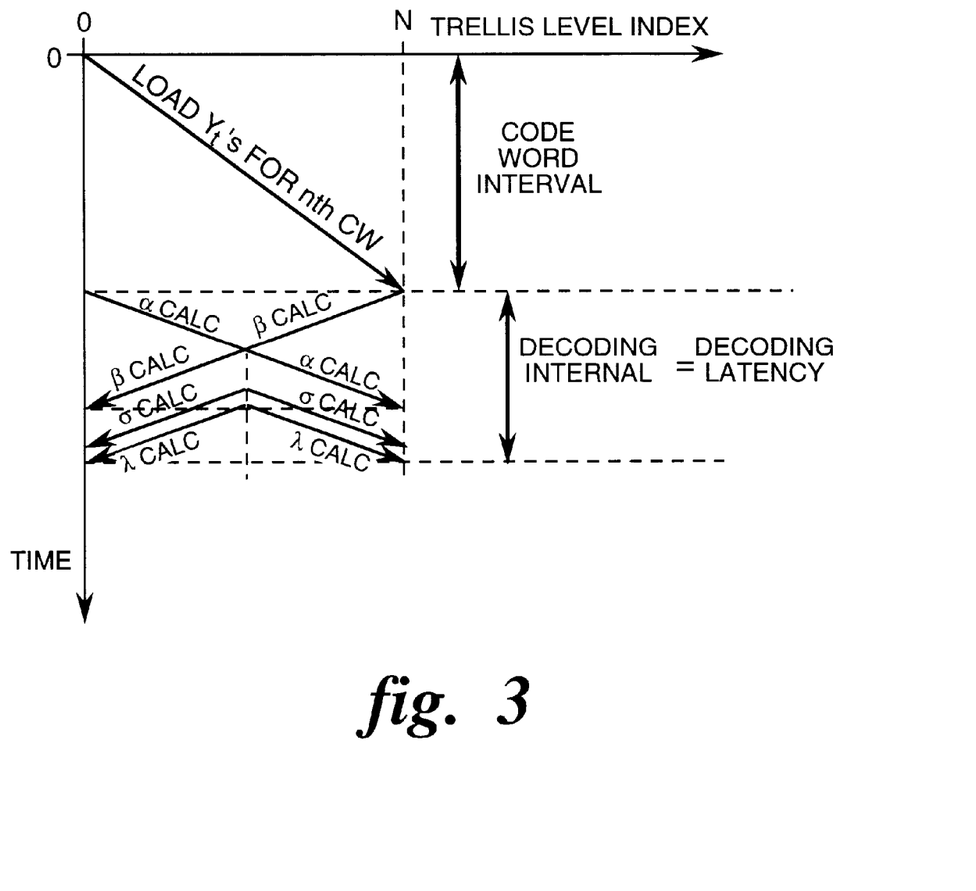
FIG. 3 is another time line representation of the parallel calculation of the $\alpha$ and $\beta$ values.

After the half-way point has been reached, i.e., the first half of the the a values have been computed and the recursion is proceeding to the right half of the time-line (as illustrated in FIGS. 2 and 3), $\sigma$ vectors may be computed from the current $\alpha$ values and the corresponding $\beta$ values which were previously computed and stored in memory. Likewise, as the $\beta$ recursion proceeds to the left half of the time-line (as illustrated in FIG. 2), $\sigma$ vectors may be computed from the current $\beta$ values and the corresponding $\alpha$ values which were previously computed and stored in memory.

Calculations of the $\gamma$ values do not involve recursions, as is apparent from the equations for $\gamma$ set forth hereinabove. In accordance with the processes herein, the $\gamma$ values need not be calculated separately for every calculation. Instead, previously calculated $\gamma$ values which were used in the $\alpha$ and $\beta$ calculations may be used to calculated the present values of $\gamma$. Such dual-use addressing for $\gamma$ values reduces memory access time and further reduces the computational burden. Alternatively, it may be desirable to use modified $\gamma$ values in which case new $\gamma$ values would be calculated.

Figure 4:
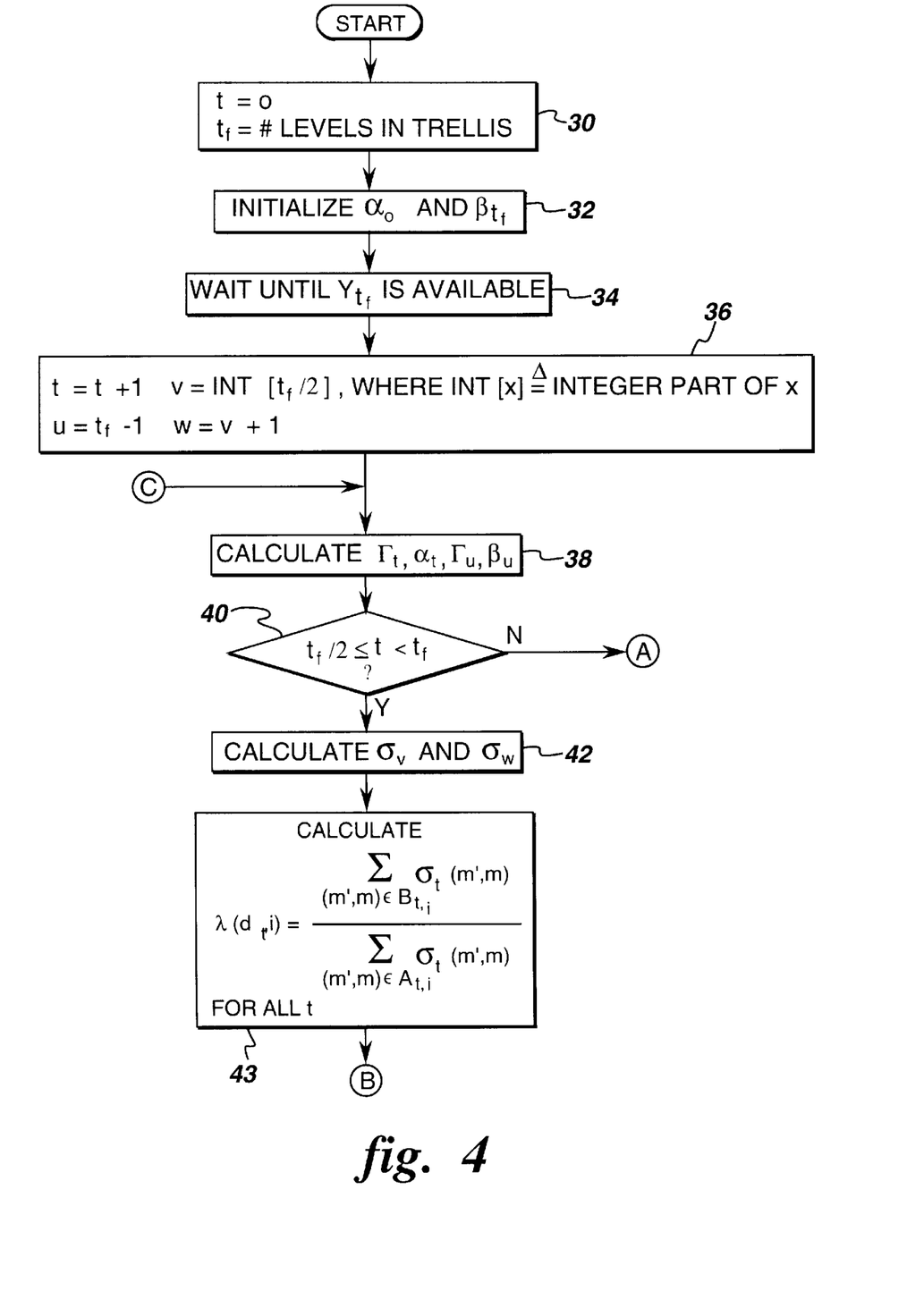
FIGS. 4 and 5 comprise a flow chart illustrating parallel processing of forward and backward recursions and sigma calculations in accordance with preferred embodiments of the present invention.
Figure 5:
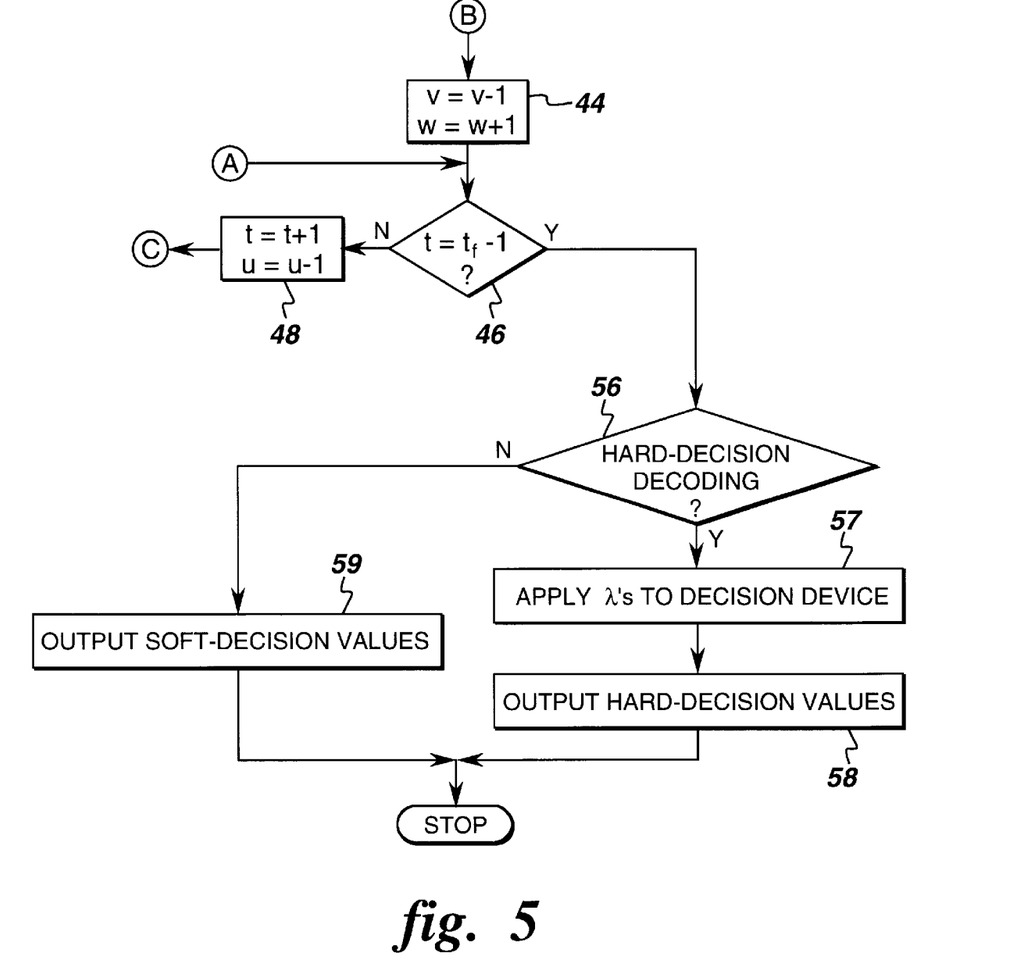

FIGS. 4 and 5 comprise a flow chart illustrating parallel processing of $\alpha$, $\beta$, and $\sigma$ values in accordance with preferred embodiments of the present invention. In step 30, the trellis level index t is set equal to zero, and the final trellis level index $t_f$ is set to represent the number of levels in the trellis. In the next step 32, $\alpha_0$ and $\beta_{tf}$ are initialized.

As soon as the last symbol in the received code word $Y_{tf}$ is received (step 34), the following operations take place in step 36:

$t=t+1$ $u=t_f-1$ $v=\text{Int}\{t_f/2\}$, where $\text{Int}\{x\}$ comprises the integer part of x, and
$w=v+1$.

Then, in step 38, the decoder computes $\gamma_t(m',m)$ using (12) and $\alpha_t(m)$ using (9) for t=1, 2, ... $t_{f-1}$, beginning with t=1. Simultaneously, it computes $\gamma_{u+1}(m,m')$ using (12) and $\beta_u(m)$ using (10) for u=$(t_f-1), (t_f-2), \ldots, 1$, beginning with u=$(t_f-1)$. The calculated values of $\alpha_t(m)$ are stored for t =1, 2, ..., $(t_f/2)$ and all m. The calculated values of $\beta_u(m)$ are stored for u = $(t_f-1), (t_f-2), \ldots, t_f-(t_f/2)$ and all m. To clarify the discussion, let $\alpha_t=[\alpha_t(0),\alpha_t(1),\ldots\alpha_t(M-1)]$ and $\beta_u=[\beta_u(0), \beta_u(1), \ldots \beta_u(M-1)]$. The recursive calculation of $\alpha_t$ and $\beta_u$ continues until at least two sets of joint state transition probabilities can be calculated (step 40). Then, calculate $\sigma_{tf/2)}(m',m)$ and $\sigma_{(t_f/2)+1}(m',m)$ are calculated using equation (17) (step 42). The calculation of these two state transition probabilities utilizes the two most recently calculated $\alpha$ and $\beta$ vectors. For the remaining $\alpha$ and $\beta$ recursions, two state transition probabilities are calculated. In calculating this pair, the current $\alpha_t$ and $\beta_u$ vectors are used so that they do not need to be stored. The other $\alpha$ and $\beta$ vectors required are read from memory. Therefore, when $\alpha_{t_f}$ and $\beta_1$ are calculated, the last two sets of state transition probabilities in this code word segment ($\alpha_1$ (m',m) and $\sigma_t(m',m)$) are immediately computed. The discussion above assumes that $t_f$ is an even number. If $t_f$ is an odd number, $\sigma_0(m',m)$ are not needed. They may be discarded or not computed.

In step 43, a function (e.g. $\lambda_t(m',m)$) of the selected probabilities is calculated as the MAP decoder's soft-decision.

In step 44, v is decremented by 1 and w is incremented by 1. Then, a test is made in step 46 to determine whether t=$t_f-1$. If not, then in step 48, t is incremented by 1 and u is decremented by 1, and the process returns to step 38. But, if the answer to the test of step 46 is positive, then operation proceeds to step 56 where a decision is made as to whether hard-decision or soft-decision decoding is selected.

If hard-decision decoding is selected (step 56), apply the soft-decision values (e.g. $\lambda_t(m',m)$) corresponding to the information bits to a decision device (step 57) and output hard-decision values for the decoded information bits (step 58). If not, output soft-decision values that are some function of the computed $\sigma_t(m',m)$ (step 59).

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A method for decoding trellis codes, comprising:

simultaneously calculating, in parallel recursive processes, forward and backward state probabilities for received trellis codewords according to a MAP decoding process;

calculating a posteriori state transition probabilities for the received component codewords beginning when the forward and backward recursive processes coincide in time.

2. The method of claim 1 wherein two a posteriori state transition probabilities are calculated per recursion.

3. The method of claim 1 wherein the trellis codes comprise turbo codes.

4. The method of claim 1 wherein the MAP decoding process comprises a log-MAP decoding process.

5. The method of claim 4 wherein the trellis codes comprises turbo codes.

6. A decoder for decoding trellis codes, comprising:

a forward and backward state probability calculator for simultaneously calculating, in parallel recursive processes, forward and backward state probabilities for received trellis codewords according to a MAP decoding process;

an a posteriori state transition calculator for calculating a posteriori state transition probabilities for the received component codewords beginning when the forward and backward recursive processes coincide in time.

7. The decoder of claim 6 wherein two a posteriori state transition probabilities are calculated per recursion.

8. The decoder of claim 6 wherein the trellis codes comprise turbo codes.

9. The decoder of claim 6 wherein the MAP decoding process comprises a log-MAP decoding process.

10. The decoder of claim 9 wherein the trellis codes comprise turbo codes.

* * * * *

UNITED STATES PATENT AND TRADEMARK OFFICE
CERTIFICATE OF CORRECTION

PATENT NO. : 6,128,765

DATED : October 3, 2000

INVENTOR(S) : John AF Ross; Abdallah M. Itani; Nick A. Van Stralen; Stephen M. Hladik It is certified that error appears in the above-identified patent and that said Letters Patent is hereby corrected as shown below:

Title should read:

A MAXIMUM A POSTERIORI ESTIMATOR WITH FAST SIGMA CALCULATOR

Signed and Sealed this

Fifteenth Day of May, 2001

*Attest:*

NICHOLAS P. GODICI

*Attesting Officer*   *Acting Director of the United States Patent and Trademark Office*